US008329556B2

(12) United States Patent
Yuan et al.

(10) Patent No.: US 8,329,556 B2
(45) Date of Patent: Dec. 11, 2012

(54) LOCALIZED ANNEALING DURING SEMICONDUCTOR DEVICE FABRICATION

(75) Inventors: Shu Yuan, Jalan Pakis (SG); Jing Lin, Clementi (SG)

(73) Assignee: Tinggi Technologies Private Limited, Singapore (SG)

( * ) Notice: Subject to any disclaimer, the term of this patent is extended or adjusted under 35 U.S.C. 154(b) by 729 days.

(21) Appl. No.: 12/158,678

(22) PCT Filed: Dec. 19, 2006

(86) PCT No.: PCT/SG2006/000395
§ 371 (c)(1),
(2), (4) Date: Oct. 13, 2009

(87) PCT Pub. No.: WO2007/073354
PCT Pub. Date: Jun. 28, 2007

(65) Prior Publication Data
US 2010/0047996 A1    Feb. 25, 2010

(30) Foreign Application Priority Data
Dec. 20, 2005  (SG) .................................. 200508210

(51) Int. Cl.
*H01L 21/44* (2006.01)
*H01L 21/46* (2006.01)

(52) U.S. Cl. .......... 438/458; 438/22; 438/660; 438/662; 257/E21.062

(58) Field of Classification Search .................. 438/458, 438/455, 22, 24, 29, 662, 660; 257/E21.062
See application file for complete search history.

(56) References Cited

U.S. PATENT DOCUMENTS

| | | | |
|---|---|---|---|
| 3,897,627 A | 8/1975 | Klatskin | |
| 4,107,720 A | 8/1978 | Pucel et al. | |
| 5,192,987 A | 3/1993 | Khan et al. | |
| 5,405,804 A | 4/1995 | Yabe | |
| 5,654,228 A | 8/1997 | Shieh et al. | |
| 5,719,433 A | 2/1998 | Delage et al. | |
| 5,811,927 A | 9/1998 | Anderson et al. | |
| 5,879,862 A | 3/1999 | Roh | |
| 5,917,202 A * | 6/1999 | Haitz et al. ...................... 257/98 |
| 6,020,261 A | 2/2000 | Weisman | |
| 6,091,085 A | 7/2000 | Lester | |

(Continued)

FOREIGN PATENT DOCUMENTS

CN             1373522 A       10/2002

(Continued)

OTHER PUBLICATIONS

Zhifang Fan, et al., "Very Low Resistance Multilayer Ohmic Contact to *n*-Gan", Applied Physics Letters, vol. 68, Issue 12, pp. 1672-1674, (Mar. 18, 1996).

(Continued)

*Primary Examiner* — Michael Trinh
(74) *Attorney, Agent, or Firm* — Blakely, Sokoloff, Taylor & Zafman LLP

(57) ABSTRACT

A process for the fabrication of semiconductor devices on a substrate, the semiconductor devices including at least one metal layer. The process includes, removing the substrate and applying a second substrate; and annealing the at least one metal layer by application of a beam of electromagnetic radiation on the at least one metal layer.

9 Claims, 4 Drawing Sheets

U.S. PATENT DOCUMENTS

| | | | |
|---|---|---|---|
| 6,117,784 | A | 9/2000 | Uzoh |
| 6,169,297 | B1 | 1/2001 | Jang et al. |
| 6,210,479 | B1 | 4/2001 | Bojarczuk et al. |
| 6,259,156 | B1 | 7/2001 | Kohno et al. |
| 6,303,405 | B1 | 10/2001 | Yoshida et al. |
| 6,307,218 | B1 | 10/2001 | Steigerwald et al. |
| 6,319,778 | B1 | 11/2001 | Chen et al. |
| 6,365,429 | B1 | 4/2002 | Kneissl et al. |
| 6,380,564 | B1 | 4/2002 | Chen et al. |
| 6,420,242 | B1 | 7/2002 | Cheung et al. |
| 6,420,732 | B1 | 7/2002 | Kung et al. |
| 6,426,512 | B1 | 7/2002 | Ito et al. |
| 6,448,102 | B1 | 9/2002 | Kneissl et al. |
| 6,455,870 | B1 | 9/2002 | Wang et al. |
| 6,492,661 | B1 | 12/2002 | Chien et al. |
| 6,509,270 | B1 | 1/2003 | Held |
| 6,562,648 | B1 | 5/2003 | Wong et al. |
| 6,573,537 | B1 | 6/2003 | Steigerwald et al. |
| 6,586,875 | B1 | 7/2003 | Chen et al. |
| 6,589,857 | B2 | 7/2003 | Ueda et al. |
| 6,627,921 | B2 | 9/2003 | Wong et al. |
| 6,627,989 | B2 | 9/2003 | Kohno et al. |
| 6,649,437 | B1 | 11/2003 | Yang et al. |
| 6,677,173 | B2 | 1/2004 | Ota |
| 6,821,804 | B2 | 11/2004 | Thibeault et al. |
| 7,166,861 | B2 * | 1/2007 | Saito et al. ............ 257/57 |
| 7,338,822 | B2 | 3/2008 | Wu et al. |
| 7,348,212 | B2 | 3/2008 | Schiaffino et al. |
| 7,547,578 | B2 * | 6/2009 | Agarwal et al. ........ 438/113 |
| 7,763,477 | B2 | 7/2010 | Yuan et al. |
| 8,004,001 | B2 | 8/2011 | Yuan et al. |
| 8,034,643 | B2 | 10/2011 | Kang et al. |
| 8,067,269 | B2 | 11/2011 | Yuan et al. |
| 8,124,994 | B2 | 2/2012 | Yuan et al. |
| 2001/0055324 | A1 | 12/2001 | Ota |
| 2002/0022286 | A1 | 2/2002 | Nikolaev et al. |
| 2002/0034835 | A1 | 3/2002 | Chen et al. |
| 2002/0093023 | A1 | 7/2002 | Camras et al. |
| 2002/0113279 | A1 | 8/2002 | Hanamaki et al. |
| 2002/0117681 | A1 | 8/2002 | Weeks et al. |
| 2002/0134985 | A1 | 9/2002 | Chen et al. |
| 2002/0137243 | A1 | 9/2002 | Chen et al. |
| 2002/0179910 | A1 | 12/2002 | Slater, Jr. |
| 2003/0038284 | A1 | 2/2003 | Kurahashi et al. |
| 2003/0064535 | A1 | 4/2003 | Kub et al. |
| 2003/0111667 | A1 | 6/2003 | Schubert |
| 2003/0151357 | A1 | 8/2003 | Uemura |
| 2003/0178626 | A1 | 9/2003 | Sugiyama et al. |
| 2003/0189212 | A1 | 10/2003 | Yoo |
| 2003/0189215 | A1 | 10/2003 | Lee et al. |
| 2003/0218179 | A1 | 11/2003 | Koide et al. |
| 2004/0026709 | A1 | 2/2004 | Bader et al. |
| 2004/0031967 | A1 | 2/2004 | Fudeta et al. |
| 2004/0033638 | A1 | 2/2004 | Bader et al. |
| 2004/0065889 | A1 | 4/2004 | Ueda et al. |
| 2004/0104395 | A1 | 6/2004 | Hagimoto et al. |
| 2004/0110395 | A1 | 6/2004 | Ueda et al. |
| 2004/0130037 | A1 | 7/2004 | Mishra et al. |
| 2004/0144991 | A1 | 7/2004 | Kikkawa |
| 2004/0217362 | A1 | 11/2004 | Slater, Jr. et al. |
| 2004/0235210 | A1 | 11/2004 | Tamura et al. |
| 2005/0014303 | A1 | 1/2005 | Tsai et al. |
| 2005/0026399 | A1 | 2/2005 | Chien et al. |
| 2005/0035354 | A1 | 2/2005 | Lin et al. |
| 2005/0082555 | A1 | 4/2005 | Chien et al. |
| 2005/0087884 | A1 | 4/2005 | Stokes et al. |
| 2005/0093002 | A1 | 5/2005 | Tsai et al. |
| 2005/0098792 | A1 | 5/2005 | Lee et al. |
| 2005/0127397 | A1 | 6/2005 | Borges et al. |
| 2005/0142875 | A1 | 6/2005 | Yoo |
| 2005/0164482 | A1 | 7/2005 | Saxlar |
| 2005/0173692 | A1 | 8/2005 | Park et al. |
| 2005/0208435 | A1 | 9/2005 | Chen et al. |
| 2006/0002442 | A1 | 1/2006 | Haberern et al. |
| 2006/0006554 | A1 | 1/2006 | Yoo et al. |
| 2006/0099730 | A1 | 5/2006 | Lee et al. |
| 2006/0124939 | A1 | 6/2006 | Lee et al. |
| 2006/0151801 | A1 | 7/2006 | Doan et al. |
| 2006/0154389 | A1 | 7/2006 | Doan |
| 2006/0154390 | A1 | 7/2006 | Tran et al. |
| 2006/0154391 | A1 | 7/2006 | Tran et al. |
| 2006/0154392 | A1 | 7/2006 | Tran et al. |
| 2006/0154393 | A1 | 7/2006 | Doan et al. |
| 2006/0157721 | A1 | 7/2006 | Tran et al. |
| 2006/0163586 | A1 | 7/2006 | Denbaars et al. |
| 2006/0186418 | A1 | 8/2006 | Edmond et al. |
| 2007/0029541 | A1 | 2/2007 | Xin et al. |
| 2008/0105303 | A1 * | 5/2008 | Oswald et al. ............ 136/261 |
| 2008/0121908 | A1 | 5/2008 | Yuan et al. |
| 2008/0164480 | A1 | 7/2008 | Kang et al. |
| 2008/0210970 | A1 | 9/2008 | Kang et al. |
| 2008/0265366 | A1 | 10/2008 | Guo et al. |
| 2010/0295014 | A1 | 11/2010 | Kang et al. |

FOREIGN PATENT DOCUMENTS

| | | |
|---|---|---|
| EP | 1 061 590 A1 | 12/2000 |
| EP | 1 139 409 A2 | 10/2001 |
| EP | 1 326 290 A2 | 7/2003 |
| EP | 1 502 284 A2 | 2/2005 |
| EP | 1 693 891 A2 | 8/2006 |
| JP | 50-074876 | 6/1975 |
| JP | 52-055480 | 5/1977 |
| JP | 59-112667 | 6/1984 |
| JP | 63-095661 | 4/1988 |
| JP | 04-078186 | 3/1992 |
| JP | 05-291621 | 11/1993 |
| JP | 07-326628 | 12/1995 |
| JP | 10-117016 | 5/1998 |
| JP | 2000-164928 | 6/2000 |
| JP | 2000-183400 | 6/2000 |
| JP | 2000-277804 | 10/2000 |
| JP | 2000-294837 | 10/2000 |
| JP | 2001-035974 | 2/2001 |
| JP | 2001-036129 | 2/2001 |
| JP | 2001-049491 | 2/2001 |
| JP | 2001-168094 | 6/2001 |
| JP | 2001-168387 | 6/2001 |
| JP | 2001-237461 | 8/2001 |
| JP | 2001-274507 | 10/2001 |
| JP | 2001-313422 | 11/2001 |
| JP | 2003-152138 | 5/2003 |
| JP | 2003-218383 | 7/2003 |
| JP | 2003-303743 | 10/2003 |
| JP | 2003-309286 | 10/2003 |
| JP | 2003-318443 | 11/2003 |
| JP | 2003-347590 | 12/2003 |
| JP | 2004-072052 | 3/2004 |
| JP | 2004-088083 | 3/2004 |
| JP | 2004-319552 | 11/2004 |
| JP | 2005-012188 | 1/2005 |
| JP | 2005-236048 | 9/2005 |
| JP | 2005-260255 | 9/2005 |
| JP | 2005-286187 | 10/2005 |
| JP | 2006-253647 | 9/2006 |
| KR | 20010088931 | 9/2001 |
| KR | 10-0338180 | 5/2002 |
| KR | 10-2002-079659 | 10/2002 |
| KR | 20040058479 | 7/2004 |
| KR | 20040104232 | 12/2004 |
| SG | 200401424-7 | 3/2004 |
| SG | 200401964-2 | 4/2004 |
| SG | 200506301-1 | 9/2005 |
| SG | 200506897-8 | 10/2005 |
| SG | 200605500-8 | 8/2006 |
| SG | 200606050-3 | 9/2006 |
| TW | 419836 B | 1/2001 |
| TW | 475276 B | 2/2002 |
| TW | 540171 B | 7/2003 |
| WO | WO 01/47039 A1 | 6/2001 |
| WO | WO 03/088320 A2 | 10/2003 |
| WO | WO 2004/102686 A1 | 11/2004 |
| WO | WO 2005/029572 A1 | 3/2005 |
| WO | WO 2005/029573 A1 | 3/2005 |
| WO | WO 2005/062745 A2 | 7/2005 |
| WO | WO 2005/064666 A1 | 7/2005 |
| WO | WO 2005/088743 | 9/2005 |
| WO | WO 2005/088743 A1 | 9/2005 |

| | | | |
|---|---|---|---|
| WO | WO 2005/096365 A1 | 10/2005 |
| WO | WO 2005/098974 A1 | 10/2005 |
| WO | WO 2005/104780 A2 | 11/2005 |
| WO | WO 2007/046773 A1 | 4/2007 |
| WO | WO 2007/037762 A1 | 5/2007 |
| WO | WO 2008/020819 A1 | 2/2008 |
| WO | WO 2008/030188 A1 | 3/2008 |

OTHER PUBLICATIONS

PCT International Preliminary Report on Patentability for PCT Counterpart Application No. PCT/SG2006/000395, 7 pgs., (Dec. 24, 2007).

PCT Written Opinion of the International Searching Authority for PCT Counterpart Application No. PCT/SG2006/000395, 5 pgs., (Feb. 26, 2007).

M.K. Kelly, et al., "Optical Process for Liftoff of Group III-Nitride Films," Physica Status Solidi (a), vol. 159, Issue 1, pp. R3-R4, (Nov. 28, 1996).

Tetsuzo Ueda, et al., "Vertical InGaN-Based Blue Light Emitting Diode with Plated Metal Base Fabricated using Laser Lift-Off Technique," Physica Status Solidi (c), vol. 0, Issue 7, pp. 2219-2222, (Oct. 20, 2003).

Chen-Fu Chu, et al., "Comparison of p-Side Down and p-Side Up GaN Light-Emitting Diodes Fabricated by Laser Lift-Off", Japan Journal of Applied Physics, vol. 42, Part 2, No. 2B, pp. L147-L150, (Feb. 15, 2003).

W.H. Li, et al., "Electrochemical Deposition of Copper on Patterned Cu/Ta(N)SiO2 Surfaces for Super Filling of Sub-Micron Features", Journal of Applied Electrochemistry, vol. 31, pp. 1395-1397, (Aug. 20, 2001).

I. Schnitzer, et al., "30% External Quantum Efficiency from Surface Textured, Thin-Film Light-Emitting Diodes," Applied Physics Letters, vol. 63, Issue 16, pp. 2174-2176, (Oct. 18, 1993).

Shyi-Ming Pan, et al., "Improvement of InGaN-GaN Light-Emitting Diodies with Surface-Textured Indium-Tin-Oxide Transparent Ohmic Contacts," IEEE Photonics Technology Letters, vol. 15, Issue 5, pp. 649-651, (May 2003).

Chul Huh, et al., "Improved Light-Output and Electrical Performance of InGaN-Based Light-Emitting Diode by Microroughening of the p-GaN Surface," Journal of Applied Physics, vol. 93, Issue 11, pp. 9383-9385, (Jun. 1, 2003).

F.A. Kish, et al., "Very High-Efficiency Semiconductor Wafer-Bonded Transparent-Substrate $(Al_xGa_{1-x})_{0.5}In_{0.5}P/GaP$ Light-Emitting Diodes," Applied Physics Letters, vol. 64, Issue 21, pp. 2839-2841, (May 23, 1994).

R.H. Horng, et al., "AlGaInP Light-Emitting Diodes with Mirror Substrates Fabricated by Wafer Bonding," Applied Physics Letters, vol. 75, Issue 20, pp. 3054-3056, (Nov. 15, 1999).

H. Sugawara, et al., "Characteristics of a Distributed Bragg Reflector for the Visible-Light Spectral Region using InGaAIP and GaAs: Comparison of Transparent- and Loss-Type Structures," Journal of Applied Physics, vol. 74, Issue 5, pp. 3189-3193, (Sep. 1, 1993).

PCT International Search Report for PCT Application No. PCT/SG2003/000222 containing Communication relating to the Results of the Partial International Search Report, 3 pgs., (Dec. 9, 2003).

PCT International Search Report for PCT Application No. PCT/SG2003/000223 containing Communication relating to the Results of the Partial International Search Report, 3 pgs., (Dec. 9, 2003).

PCT International Search Report for PCT Application No. PCT/SG2005/000061 containing Communication relating to the Results of the Partial International Search Report, 2 pgs., (May 12, 2005).

PCT International Search Report for PCT Application No. PCT/SG2005/000062 containing Communication relating to the Results of the Partial International Search Report, 2 pgs., (May 12, 2005).

PCT International Search Report for PCT Counterpart Application No. PCT/SG2005/000254 containing Communication relating to the Results of the Partial International Search Report, 4 pgs., (Nov. 16, 2006).

PCT International Search Report for PCT Application No. PCT/SG2006/000255 containing Communication relating to the Results of the Partial International Search Report, 3 pgs., (Nov. 6, 2006).

PCT International Search Report for PCT Counterpart Application No. PCT/SG2005/000395 containing Communication relating to the Results of the Partial International Search Report, 3 pgs., (Feb. 26, 2007).

PCT International Search Report for PCT Application No. PCT/SG2007/000261 containing Communication relating to the Results of the Partial International Search Report, 3 pgs., (Oct. 12, 2007).

PCT International Search Report for PCT Application No. PCT/SG2007/000288 containing Communication relating to the Results of the Partial International Search Report, 3 pgs., (Nov. 9, 2007).

Supplementary European Search Report for European Application No. 05711220.3-2222, 3 pgs., (Nov. 30, 2010).

Supplementary European Search Report for European Application No. 06784267.4-1235, 4 pgs., (Feb. 4, 2011).

Supplementary European Search Report for European Application No. 03818739, 1 pg., (Jan. 19, 2011).

Written Opinion for Chinese Patent Application No. 3827175.3, 6 pgs., (May 23, 2011).

* cited by examiner

LOCALIZED ANNEALING DURING SEMICONDUCTOR DEVICE FABRICATION

CROSS-REFERENCE TO OTHER APPLICATIONS

This is a National Phase of International Application No. PCT/SG2006/00395, filed on Dec. 19, 2006, which claims priority from Singaporean Patent Application No. 200508210-2, filed on Dec. 20, 2005.

FIELD OF THE INVENTION

This invention relates to optical annealing during semiconductor device fabrication and refers particularly, though not exclusively, to annealing during semiconductor device fabrication by use of lasers or lamps after the substrate is removed.

BACKGROUND OF THE INVENTION

Many semiconductor devices are fabricated in large numbers on a substrate. During fabrication they incorporate at least one layer of a metal. Most metal layers applied to semiconductors devices during the fabrication of the semiconductor devices are annealed following their application. Annealing is normally in an oven or the like for a period of time and a predetermined temperature. Often the temperature is relatively high, for example, the annealing temperature for the Ohmic contact metal to n-type GaN is done at 900 C [Z. Fan et al, Applied Physics Letters, Volume 68, page 1672, 1996]. The use of relatively high temperatures has many problems that degrade device performance. For example, unwanted atomic diffusions can take place at high annealing temperatures, degrading the device performance. It is desirable to have the annealing done at low temperatures, preferably at room temperature. Due to the difference between the thermal expansion coefficients of different materials on a wafer (such as, for example, the substrate, epitaxial layers, metals, dielectrics, and so forth), conventional annealing often causes thermal stress in the wafer as the heating is applied to the whole wafer. If the stress is not buffered properly, it often causes cracking in the wafer or the peeling of thin films from the wafer, or creating defects in the wafer. This is especially true in certain wafer fabrication technologies where the substrate is removed and the epitaxial layers are bonded to another mechanical support that acts like a new substrate.

SUMMARY OF THE INVENTION

In accordance with a first preferred aspect, in a process for the fabrication of semiconductor devices being fabricated on a substrate and including at least one metal layer, after removal of the substrate and applying a second substrate, there is provided the step of annealing the at least one metal layer by application of a beam of electromagnetic radiation on the least one metal layer.

According to a second preferred aspect there is provided a process for the fabrication of semiconductor devices being fabricated on a substrate and including at least one metal layer, the process comprising removing the substrate from the semiconductor devices, forming a second substrate on the at least one metal layer, and annealing the at least one metal layer by application of a beam of electromagnetic radiation at a number of locations on the at least one metal layer.

For both aspects the second substrate may be applied to the semiconductor devices before or after the substrate is removed. The beam of electromagnetic radiation may be a laser beam, light from at least one lamp, or light from a bank of lamps.

The second substrate may be applied to the semiconductor devices on a second surface of the semiconductor devices, the substrate having been removed from a first surface of the semiconductor devices, the first and second surfaces being different. The first surface may be opposite the second surface.

The duration of the application of the laser beam may also be determined by the metal of the at least one metal layer, and the thickness of the at least one metal layer. The laser beam may be of a frequency and intensity determined by the metal of the at least one metal layer, the thickness of the at least one metal layer, and the material of the semiconductor devices.

There may be a plurality of metal layers. The plurality of metal layers may be annealed sequentially or simultaneously. The laser beam may be sequentially applied to the number of locations.

The laser beam may be applied directly to the at least one layer, or may be applied through the semiconductor device to the at least one metal layer. It may be to an interface of the at least one metal layer and the semiconductor device.

The beam of electromagnetic radiation may be applied at a number of locations on the at least one metal layer.

For both aspect the number and spacing of the locations may be determined by the metal of the at least one metal layer, and a thickness of the at least one metal layer.

A mask may be placed between a source of the beam of electromagnetic radiation and the semiconductor devices; the screen having at least one aperture therethrough for the passage through the at least one aperture of the beam of electromagnetic radiation. The at least one aperture may be sized and shaped to be substantially the same as the at least one metal layer.

BRIEF DESCRIPTION OF THE DRAWINGS

In order that the present invention may be fully understood and readily put into practical effect, there shall now be described by way of non-limitative example only preferred embodiments of the present invention, the description being with reference to the accompanying illustrative drawings.

In the drawings.

DETAILED DESCRIPTION OF THE PREFERRED EMBODIMENTS

Figure 1:
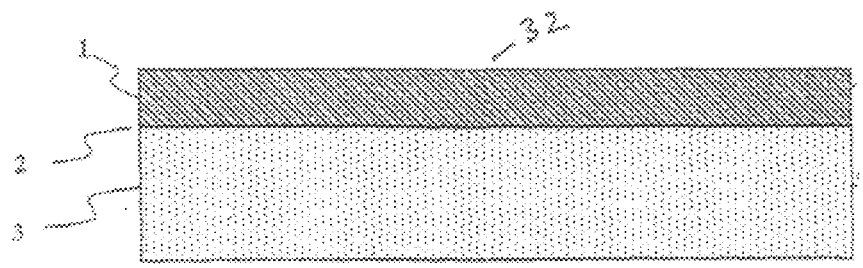
FIG. 1 is a schematic vertical cross-sectional view of a preferred form of semiconductor device on which will be performed a preferred method.
Figure 2:
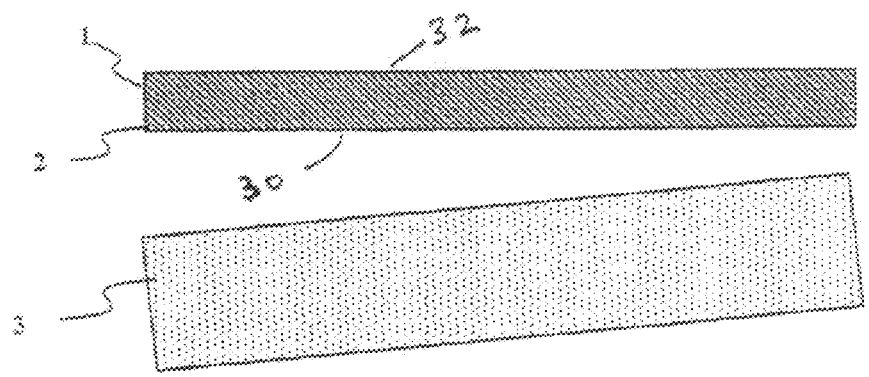
FIG. 2 is a view corresponding to FIG. 1 after removal of the first substrate.
Figure 3:
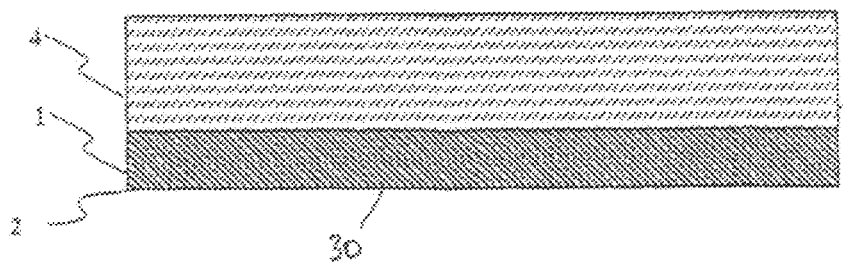
FIG. 3 is a view corresponding to FIGS. 1 and 2 after formation of the second substrate.
Figure 4:
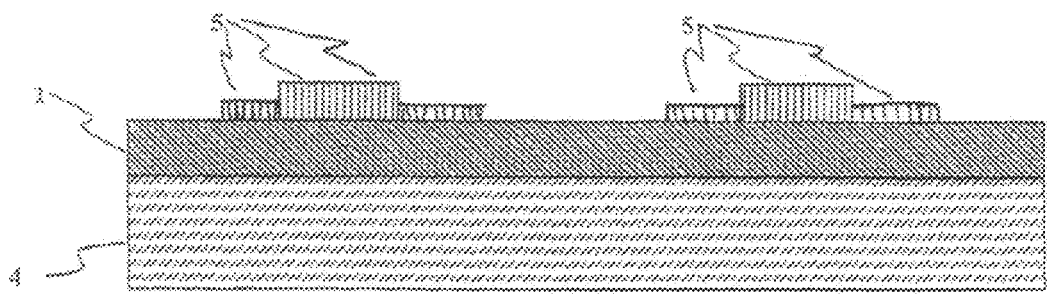
FIG. 4 is a side view corresponding to FIGS. 1 to 3 after formation of an ohmic contact layer.
Figure 5:
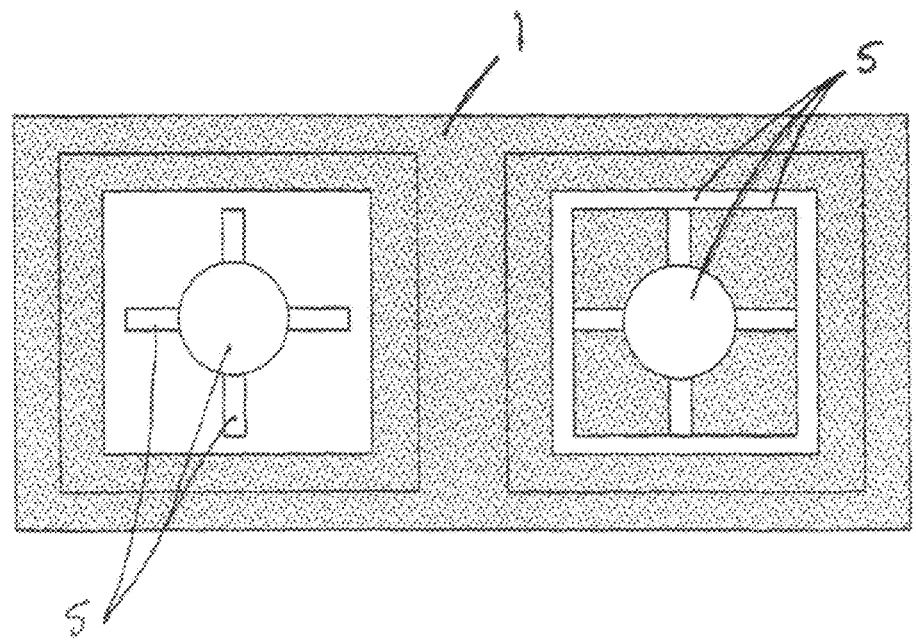
FIG. 5 is a top view corresponding to FIG. 4.

To refer to the drawings there is shown a substrate 3 on which are epitaxial layers 1 and quantum well layer that together from the beginning of a semiconductor device. As shown in FIG. 2 the substrate is removed from the quantum well layer 2 and expitaxial layers 1 by any known technique. A second substrate 4 (such as for example, copper) is added above the epitaxial layer 1 (FIG. 3). FIGS. 4 and 5 show that ohmic contact layers 5 are then formed on the epitaxial layers 1. All of this may be in accordance with one or more of our earlier application PCT/SG2003/00022, PCT/SG2003/000223, PCT/SG2005/00061, PCT/SG2005/000062, SG200506301-1 and SG200506897-8; the contents of which are incorporated herein by reference as if disclosed herein in their entirety.

The second substrate 4 is preferably formed on a second surface 32 of the semiconductor device 20, the substrate 3 having been removed from a first surface 30 of the semiconductor devices 20, the first and second surfaces 30, 32 being different. Preferably, the first and second surfaces 30, 32 are opposite surfaces. The second substrate 4 may be formed on or applied to the second surface either before or after the substrate 3 is removed.

Figure 6:
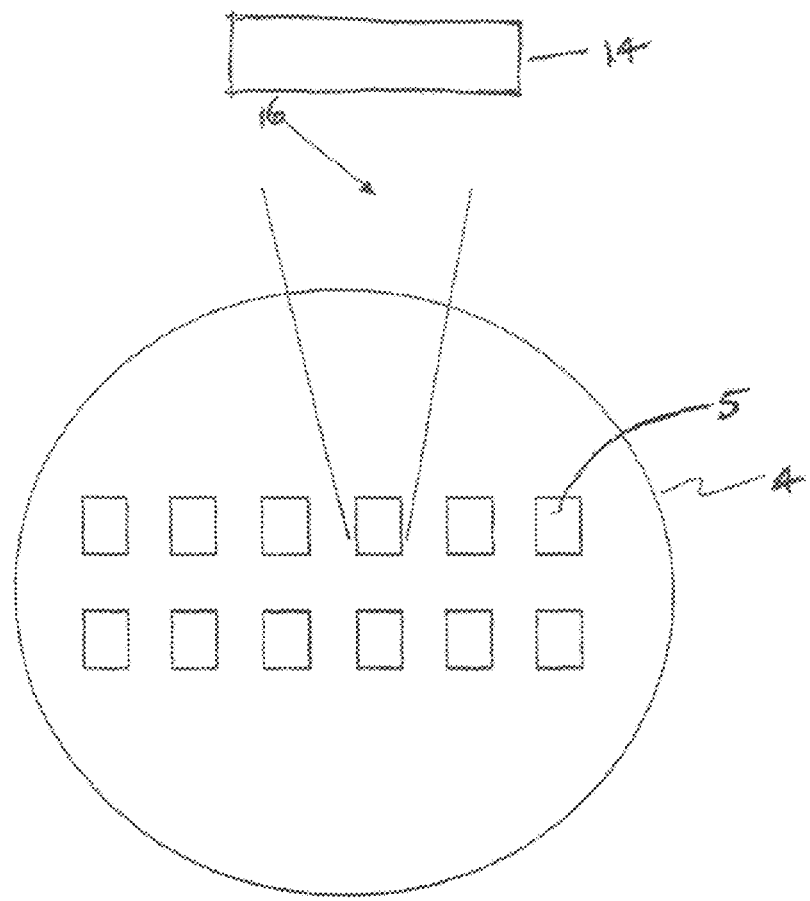
FIG. 6 is a schematic top view of the semiconductor devices of FIGS. 4 and 5 during annealing.
Figure 7:
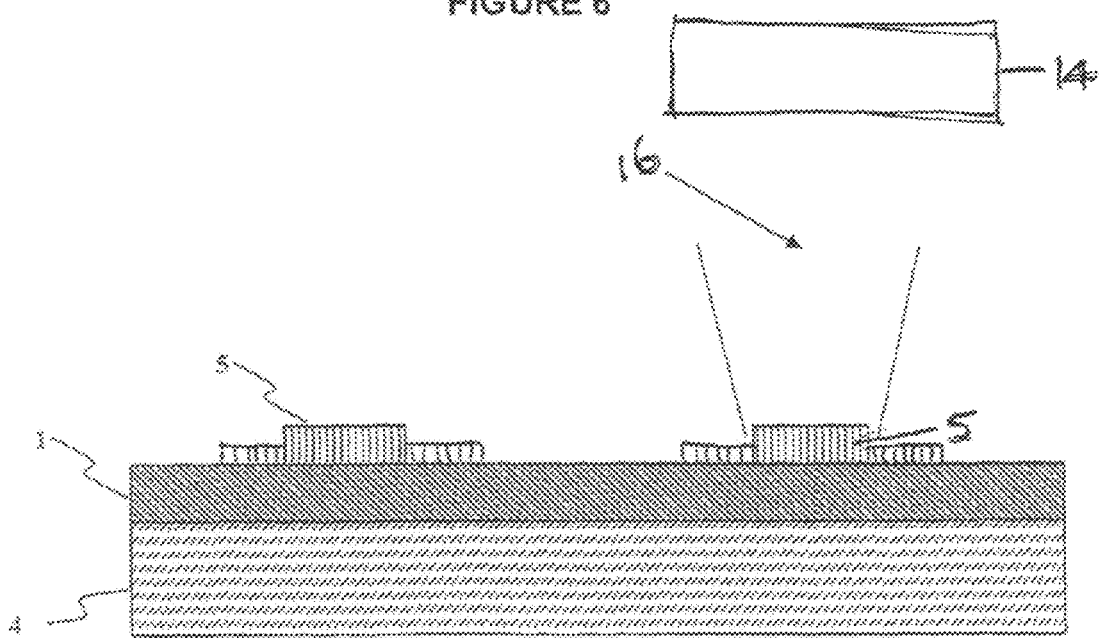
FIG. 7 is a side view corresponding to the FIG. 6.

FIGS. 6 and 7 illustrate an apparatus 14 for producing a beam 16 of electromagnetic radiation. The apparatus 14 may be a laser, at least one lamp, or a bank of lamps. The substrate 4 has a number of semiconductor devices 20 being fabricated on the substrate 4. Although twelve semiconductor devices 20 and shown, there may be any suitable number. After the ohmic contacts 5 are formed (after removal of the substrate 3), the ohmic contacts 5 are annealed to enable them to be more strongly adhered to the epitaxial layers 1. This is by a form of fusion of the ohmic contacts 5 and the epitaxial layers 1 at their interface.

The apparatus 14 produces the beam 16. The beam 16 will be a laser beam if apparatus 14 is a laser, or will be light of desired frequency if apparatus 14 is at least one lamp, or a bank of lamps. The beam 16 is focused on the exposed surface of the ohmic contact 5. As such the ohmic contact 5 is heated by the beam 16. Due to the inherent heat conductivity of the ohmic contact 5, the beam 16 does not need to be applied to the entirety of the surface of the ohmic contact 5

The beam 16 is shown being applied to one semiconductor device 20. It may be applied to two or more simultaneously, up to being simultaneously applied to all semiconductor devices 20.

Figure 8:
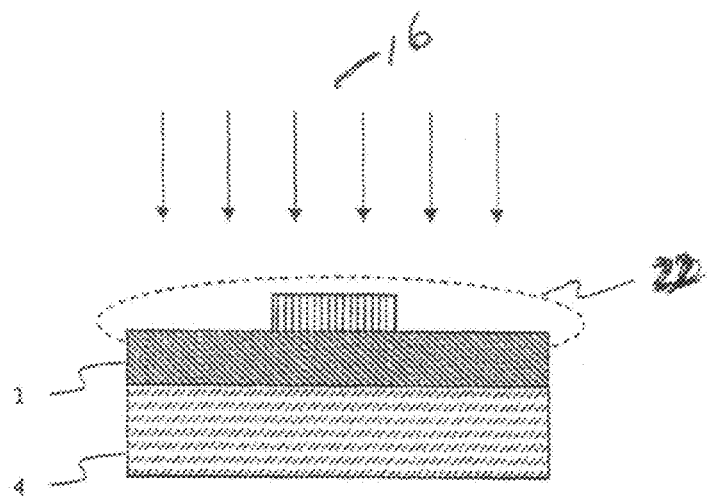
FIG. 8 is a localized side view corresponding to FIG. 7.

As shown in FIG. 8, the heat conductivity of the ohmic contact 5 means that heating is limited to the immediate area 30 of the ohmic contact 5 and thus not all of the epitaxial layers 1 are heated. In this way the heat in the expitaxial layers 1 is dispersed through the epitaxial layers 1 and does not affect the interface of epitaxial layers 1 and the second substrate 4. Therefore the temperature at the interface of the epitaxial layer 1 and the second substrate 4 will be less that the temperature at the interface of the ohmic contact 5 and the epitaxial layer 1.

The duration, wavelength, radiation power, and radiation power density of the application of the electromagnetic beam 16 may be determined by the metal of the at least one metal layer 5, and the thickness of the at least one metal layer 5, and the materials of the semiconductor devices 20.

Figure 9:
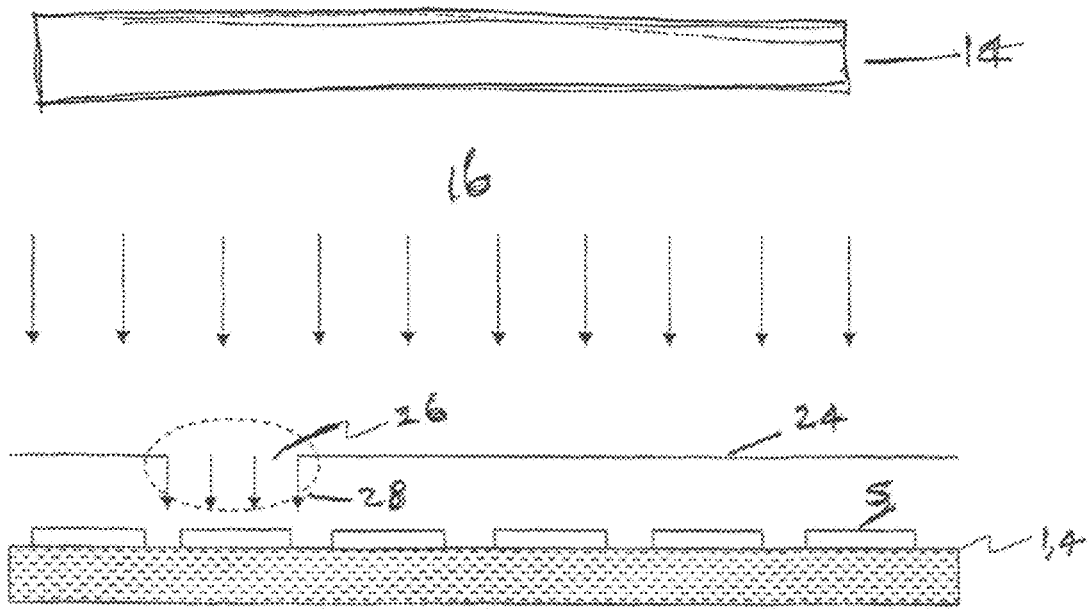
FIG. 9 is a schematic side view corresponding to FIG. 6 of a second embodiment.

FIG. 9 shows a second embodiment. This may be used when the beam 16 is laser beam, but should be used when the beam 16 is of light. A mask 24 is placed between source 14 and the semiconductor devices 20. The mask 24 has at least one aperture 26 that is preferably sized and shaped to be substantially the same as that of the area to be annealed—in this case the ohmic contact 5. In that way the light 28 passing through the aperture 26 only contacts the ohmic contact 5 and not the epitaxial layers 1. There may be the same number of apertures 26 in screen 24, and their location and spacing may be the same, as the ohmic contact 5.

This has the advantage of reducing fabrication time, reducing risk of cross-contamination of wafers, and increasing productivity. It also enables device repair, and localized annealing.

By use of this invention, localized optical annealing is used in semiconductor device fabrication, where the original wafer substrate is removed and the semiconductor layers are transferred to a new substrate either before or after the optical-annealing. Both laser annealing and lamp annealing may be used. Laser annealing can be applied to where annealing is required by directing the laser beam to that area. A broad light beam that is generated by a lamp, a bank of lamps, or a broadened laser beam can also be applied to the whole surface of the wafer, or to an interface in the wafer if the light is so chosen that it can pass certain layers (or substrate) of the wafer without being significantly absorbed before reaching the interface.

The above-described process may also be used to anneal a more substantial metal layer such as, for example, the second substrate 4. In this case, and as the second substrate 4 is a layer of a metal (copper) that has high conductivity, the beam 16 does not need to be applied to the entirety of the metal layer 4, but is applied sequentially to locations on the surface of the metal layer 4 for annealing of the metal layer 4 to take place. The number and spacing of the locations, the duration of the application of the beam 16 at each location, the intensity of the laser beam 16 and the frequency of the laser beam 16 will be determined by the metal of the metal layer 4, and the thickness of the metal layer 4. Alternatively, the beam 16 may be applied simultaneously to the number of locations. Preferably, the order of application of the beam 16 matches heat flow in the metal layer 4 to maximize the annealing. If the beam 16 is from a lamp or bank of lamps, the aperture(s) 26 will be sized, shaped, spaced and located to substantially match the size, shape, spacing and location of the metal layers 4.

The beam 16 may be applied directly to the at least one metal layer 22, or may be applied to the at least one metal layer 22 through the semiconductor device 20. In the latter case, the beam 16 is preferably applied to the interface between the at least one metal layer 22 and the semiconductor devices 20.

If there is more than one layer in the least one metal layer 22, each layer may be annealed sequentially, or simultaneously.

The nature of the beam 16 will depend significantly on the materials of the ohmic or metal layer 5, and the epitaxial layers 1. This will include the thickness of the ohmic or metal layer 5. For a laser beam 16, the nature of the laser, especially the laser wavelength and the laser conditions, will be determined in this way. Laser conditions include pulse width of the laser, number of pulses, the frequency of the pulses, and the power and density of the laser beam.

Whilst there has been described in the foregoing description preferred embodiments of the present invention, it will be understood by those skilled in the technology concerned that many variations or modifications in details of design or construction may be made without departing from the present invention.

What is claimed:

1. A process for reducing cross-contamination of wafers during fabrication of semiconductor devices on a substrate and at least one metal layer, the process comprising:
    removing the substrate and applying a second substrate to the semiconductor devices; and annealing the at least one metal layer by application of a beam of electromagnetic radiation directly on the at least one metal layer, wherein a mask is placed between a source of the beam of electromagnetic radiation and the semiconductor devices, the mask having at least one aperture therethrough for the passage of the beam of electromagnetic radiation through the at least one aperture during the annealing, the at least one aperture being sized and shaped to be substantially the same as the at least one metal layer being annealed.

2. The process of claim 1, wherein the second substrate is applied to the semiconductor devices in a manner selected from the group consisting of: before the substrate is removed, and after the substrate is removed.

3. The process of claim 1, wherein the second substrate is applied to the semiconductor devices on a second surface of the semiconductor devices, the substrate been removed from a first surface of the semiconductor devices, the first and second surfaces being different; the first surface being opposite the second surface.

4. The process of claim 1, wherein the beam of electromagnetic radiation is applied at a number of locations on the at least one metal layer, the number and spacing of the locations being determined by the metal of the at least one metal layer, and a thickness of the at least one metal layer; laser beam being applied sequentially to the number of locations.

5. The process of claim 1, wherein the duration, wavelength, radiation power, and radiation power density of the application of the electromagnetic beam are determined by the metal of the at least one metal layer, and the thickness of the at least one metal layer, and the materials of the semiconductor devices.

6. The process of claim 1, wherein the laser beam is of a frequency and intensity determined by the metal of the at least one metal layer, and the thickness of the at least one metal layer, and the semiconductor devices material.

7. The process of claim 1, wherein there are a plurality of metal layers, the plurality of metal layers being annealed in a manner selected from the group consisting of: sequentially, and simultaneously.

8. The process as claimed in claim 1, wherein the at least one metal layer is an ohmic contact layer.

9. The process of claim 1, wherein the beam of electromagnetic radiation is selected from the group consisting of: a laser beam, light from at least one lamp, and light from a bank of lamps.

* * * * *